(12) United States Patent
Mizan et al.

(10) Patent No.: US 12,107,416 B2
(45) Date of Patent: Oct. 1, 2024

(54) INTEGRATED BIDIRECTIONAL ESD PROTECTION CIRCUIT FOR POWER SEMICONDUCTOR SWITCHING DEVICES

(71) Applicant: GaN Systems Inc., Kanata (CA)

(72) Inventors: Ahmad Mizan, Kanata (CA); Edward Macrobbie, Nepean (CA)

(73) Assignee: GaN Systems Inc., Kanata (CA)

( * ) Notice: Subject to any disclaimer, the term of this patent is extended or adjusted under 35 U.S.C. 154(b) by 163 days.

(21) Appl. No.: 17/975,092

(22) Filed: Oct. 27, 2022

(65) Prior Publication Data

US 2023/0198252 A1 Jun. 22, 2023

Related U.S. Application Data

(60) Provisional application No. 63/290,721, filed on Dec. 17, 2021.

(51) Int. Cl.
 *H02H 9/00* (2006.01)
 *H01L 27/02* (2006.01)
 *H02H 9/04* (2006.01)

(52) U.S. Cl.
 CPC ......... *H02H 9/046* (2013.01); *H01L 27/0255* (2013.01); *H01L 27/0266* (2013.01); *H01L 27/0288* (2013.01)

(58) Field of Classification Search
 None
 See application file for complete search history.

(56) References Cited

U.S. PATENT DOCUMENTS 8,144,441 B2   3/2012   Ping et al.
10,290,623 B2  5/2019   Roberts et al.
(Continued)

OTHER PUBLICATIONS

Zhou, C. et al., "On-Chip Gate ESD Protection for AlGaN/GaN E-Mode Power HEMT Delivering >2kV HBM ESD Capability," 2019 IEEE 7th Workshop on Wide Bandgap Power Devices and Applications (WiPDA), Oct. 29-31, 2019, pp. 175-176, [doi: 10.1109/WiPDA46397.2019.8998945].

(Continued)

*Primary Examiner* — Stephen W Jackson
(74) *Attorney, Agent, or Firm* — Miltons IP/p.i.

(57) ABSTRACT

A GaN semiconductor power switching device ($Q_{main}$) comprising an integrated ESD 1protection circuit is disclosed, which is compatible with driving $Q_{main}$ with a positive gate-to-source voltage Vgs for turn-on and a negative Vgs for turn-off, during normal operation. The ESD protection circuit is connected between a gate input of $Q_{main}$ and a source of $Q_{main}$, and comprises a clamp transistor Q1, a positive trigger circuit and a negative trigger circuit, for turning on the gate of the clamp transistor Q1 responsive to an ESD event at the gate input of $Q_{main}$. The positive and negative trigger circuits each comprise a plurality of diode elements in series, having threshold voltages which are configured so that each of the positive trigger voltage and the negative trigger voltage can be adjusted. The ESD circuit topology requires smaller integrated resistors and can be implemented with reduced layout area compared to conventional integrated ESD circuits.

20 Claims, 7 Drawing Sheets

(56) References Cited

U.S. PATENT DOCUMENTS

| | | | |
|---|---|---|---|
| 10,819,110 B2* | 10/2020 | Kumar | H01L 27/0285 |
| 2016/0372920 A1 | 12/2016 | Kinzer et al. | |
| 2018/0026029 A1* | 1/2018 | Lin | H01L 28/20 |
| | | | 361/56 |
| 2019/0190256 A1* | 6/2019 | Agarwal | H02H 9/046 |
| 2019/0237456 A1* | 8/2019 | Lai | H01L 27/0605 |
| 2020/0365581 A1 | 11/2020 | Guan et al. | |

OTHER PUBLICATIONS

Qiu, Y. et al., "Using MOSFET Controllers to Drive GaN E-HEMTs", Bodo's Power Systems, Aug. 2019; 3 pages.

* cited by examiner

135 x (805+611)
191k unit area
1 ESD structure

Fig. 5 (Prior Art)

87.5 x (1149)
100k unit area
2 ESD Structures

B. $I_g$
Conventional ESD protection circuit

C. $I_g$
ESD protection circuit of example embodiment

INTEGRATED BIDIRECTIONAL ESD PROTECTION CIRCUIT FOR POWER SEMICONDUCTOR SWITCHING DEVICES

CROSS-REFERENCE TO RELATED APPLICATION(S)

This application claims priority from U.S. provisional patent application No. 63/290,721 filed Dec. 17, 2021, entitled "Integrated Bidirectional ESD Protection Circuit for Power Semiconductor Switching Devices", which is incorporated herein by reference in its entirety.

TECHNICAL FIELD

This invention relates to electrostatic discharge (ESD) protection circuits for power semiconductor switching devices.

BACKGROUND

There is a need for integrated ESD protection circuits for power semiconductor switching devices. For example, an ESD event may occur during assembly and packaging, or during operation. During an ESD event, a high potential voltage and current are rapidly discharged into a device or circuit, which typically results in the destruction of devices and circuits that are not protected from ESD events.

Power semiconductor switching devices may comprise lateral high electron mobility transistors (HEMTs), such as lateral enhancement-mode (E-mode) HEMTs fabricated with wide-bandgap semiconductor technologies, e.g. Gallium Nitride (GaN) based semiconductor materials. Some example ESD protection circuits are disclosed in U.S. Pat. No. 10,290,623 B2, issued May 14, 2019, J. Roberts et al., entitled "Gate Input Protection for Devices and Systems comprising High Power E-mode GaN transistors", and references cited therein.

For example, other ESD protection circuits are disclosed in:
- United States patent publication no. US2018/0026029 A1, published Jan. 25, 2018, Y-S Lin et al., entitled "Integrated ESD protection circuit for GaN based device";
- United States patent no. U.S. Pat. No. 8,144,441B2, issued Mar. 27, 2012, A. T. Ping et al., entitled "Electrostatic Discharge Protection Circuit for Compound Semiconductor Devices and Circuits";
- United States patent publication no. US2016/0372920 A1, published Dec. 22, 2016, Kinzer et al., entitled "Integrated ESD protection circuits in GaN";
- An article by C. Zhou et al., entitled "On-Chip Gate ESD Protection for AlGaN/GaN E-Mode Power HEMT Delivering >2 kV HBM ESD Capability," 2019 IEEE 7th Workshop on Wide Bandgap Power Devices and Applications (WiPDA), 29-31 Oct. 2019, pp. 175-176, [doi: 10.1109/WiPDA46397.2019.8998945]; and
- United States patent publication no. US2020/0365581 A1, published Nov. 19, 2020, Y. Guan et al., entitled "Electrostatic Protection Circuit and Electronic Device".

For many applications, GaN power transistors may be driven with a positive gate voltage for turn-on and a zero voltage for turn-off. For example, a gate driver may provide a Vgs in a range ~5V to ~7V, e.g. 6V, for turn-on, and a gate-to-source voltage Vgs of 0V for turn-off. For some power switching applications using E-mode lateral GaN HEMTs, it is desirable to provide a positive gate drive voltage, e.g. $V_{gs}$=+6V, for turn-on and a negative gate drive voltage, e.g. $V_{gs}$=−3V for turn-off. For example, as described in an article by Y. Qiu et al., entitled "Using MOSFET Controllers to Drive GaN E-HEMTs", Bodo's Power Systems, August 2019, a standard MOSFET controller, e.g. providing a 12V gate drive may be used with a level shift circuit, such as GaN Systems Inc. EZDrive™ solution, to provide a positive $V_{gs}$, e.g. +6.5V for turn-on, and a negative $V_{gs}$, e.g. −5.8V for turn-off.

Conventional ESD protection circuits have one or more drawbacks, e.g. they may not be suitable when using a negative gate-source voltage Vgs for turn-off and/or they require large resistors which take up a large die area.

There is a need for improved or alternative ESD protection circuits for semiconductor power switching devices, such as E-mode lateral GaN HEMTs

SUMMARY OF INVENTION

The present invention seeks to provides improved or alternative ESD protection circuits for semiconductor power switching devices, e.g. comprising high voltage/high current wide-bandgap semiconductor power devices, such as E-mode GaN HEMTs, which mitigate or circumvent at least one of the above-mentioned issues.

One aspect of the invention provides a GaN semiconductor power switching device comprising a power transistor switch (Qmain) and an integrated ESD protection circuit which is compatible with driving Qmain, during normal operation, with a positive gate-to-source voltage Vgs for turn-on and a negative Vgs for turn-off, the ESD protection circuit comprising a clamp transistor Q1 connected between a gate input of Qmain and a source of Qmain to provide a discharge path for an ESD event, and a positive trigger circuit and a negative trigger circuit connected in parallel between a drain of Q1 and a source of Q1 for turning-on a gate of the clamp transistor Q1 responsive to a positive ESD event or a negative ESD event at the gate input of Qmain, wherein:
the positive trigger circuit comprises a first string of a first plurality (n) of diode elements in series connected between the drain of Q1 and the gate of Q1, the first string of the plurality of diode elements being connected in series with a first resistor R1 and a first diode D3 to the source of Q1, a positive trigger voltage being a sum of threshold voltages of the n diode elements; the positive trigger circuit thereby being conductive to turn-on the clamp transistor to discharge a positive ESD event when Vgs meets or exceeds the positive trigger voltage; the negative trigger circuit comprising a second string of a second plurality (m) of diode elements in series connected between the source of Q1 and the gate of Q1, the second string of the plurality of diode elements being connected in series with a second resistor R2 and a second diode D3 to the drain of Q1, a negative trigger voltage being a sum of threshold voltages of the m diode elements; the negative trigger circuit thereby being conductive to turn-on the clamp transistor to discharge a negative ESD event when Vgs is more negative than the negative trigger voltage.

Another aspect of the invention provides an electrostatic discharge (ESD) protection circuit monolithically integrated with a power semiconductor switching device (Qmain), wherein Qmain is compatible with being driven by a positive gate-to-source voltage Vgs for turn-on for normal operation and a negative Vgs for turn-off for normal operation, the ESD protection circuit comprising:

a clamp transistor Q1 connected between a gate input of Qmain and a source of Qmain to provide a discharge path for an ESD event, and a positive trigger circuit and a negative trigger circuit connected in parallel between a drain of Q1 and a source of Q1 for turning on a gate of the clamp transistor Q1 responsive to a positive ESD event or a negative ESD event at the gate input of Qmain, wherein:

the positive trigger circuit comprises a first string of a first plurality (n) of diode elements in series connected between the drain of Q1 and the gate of Q1, the first string of the plurality of diode elements being connected in series with a first resistor R1 and a first diode D3 to the source of Q1, a positive trigger voltage being a sum of threshold voltages of the n diode elements; the positive trigger circuit thereby being conductive to turn-on the clamp transistor to discharge a positive ESD event when Vgs meets or exceeds the positive trigger voltage; the negative trigger circuit comprising a second string of a second plurality (m) of diode elements in series connected between the source of Q1 and the gate of Q1, the second string of the plurality of diode elements being connected in series with a second resistor R2 and a second diode D3 to the drain of Q1, a negative trigger voltage being a sum of threshold voltages of the m diode elements; the negative trigger circuit thereby being conductive to turn-on the clamp transistor to discharge a negative ESD event when Vgs is more negative than the negative trigger voltage.

In some embodiments, a transistor Q2 is connected in parallel with said first diode D3 of the positive trigger circuit, the gate of the Q2 being connected to the gate input of Qmain.

In practice, the diode elements may comprise transistor elements configured as diodes.

The gate width of the Q1 may be an order of magnitude greater than the gate widths of the diode elements of the positive trigger circuit and the negative trigger circuit, so that Q1 provides a primary discharge path for rapid, e.g. sub-microsecond, dissipation of positive and negative ESD events. For example, Q1 has a gate width in a range of a few mm, and the diode elements of the positive trigger circuit and the negative trigger circuit, have sub mm gate widths. For example, the first and second resistors R1 and R2 of the positive and negative trigger circuits have a value in a range of 1 kΩ to 10 kΩ.

The resistors R1 and R2 may be transistor elements configured as resistors, e.g. D-mode GaN HEMTs which may be referred to as 2DEG resistors, or the resistors may be provided by high resistive metal layers.

The number of diode elements n of the positive trigger circuit and the number diode elements of the negative trigger circuit which set the positive trigger voltage and the negative trigger voltage, and the gate width of Q1 are selected to maintain the gate voltage of Qmain during an ESD event within a specified range for safe operation, e.g. between −20V to +10V, or e.g. between −10V to +10V, or other suitable gate voltage range.

For example, where the semiconductor power switching device Qmain comprises a large gate width enhancement-mode GaN HEMT, said large gate width being in a range of tens of millimeters to hundreds of millimeters (e.g. comprising many hundreds or thousands of transistor cells connected in parallel), the clamp transistor Q1 may be a GaN HEMT having a gate width in a range of a few millimeters, and the diode elements of the positive and negative trigger circuits being diode configured GaN HEMTs having submillimeter gate widths. First and second resistors R1 and R2 of the positive and negative trigger circuits may have a value in a range of 1 kΩ to 10 kΩ.

Another aspect of the invention provides a semiconductor power switching device comprising a power transistor switch ($Q_{main}$) and an integrated ESD protection circuit which is compatible with driving $Q_{main}$, during normal operation, with a positive gate-to-source voltage Vgs for turn-on and a negative Vgs for turn-off, the ESD protection circuit comprising a clamp transistor Q1 connected between a gate input of $Q_{main}$ and a source of $Q_{main}$ to provide a bidirectional discharge path for an ESD event, and a positive trigger circuit and a negative trigger circuit connected in parallel between a drain of Q1 and a source of Q1 for turning-on a gate of the clamp transistor Q1 responsive to a positive ESD event or a negative ESD event at the gate input of $Q_{main}$, wherein:

the positive trigger circuit comprises a first string of a first plurality (n) of diode elements in series connected between the drain of Q1 and the gate of Q1, the first string of the plurality of diode elements being connected in series with a first resistor R1 and a first diode D3 to the source of Q1, a positive trigger voltage being a sum of threshold voltages of the n diode elements; the positive trigger circuit thereby being conductive to turn-on the clamp transistor to discharge a positive ESD event when Vgs meets or exceeds the positive trigger voltage;

the negative trigger circuit comprising a second string of a second plurality (m) of diode elements in series connected between the source of Q1 and the gate of Q1, the second string of the plurality of diode elements being connected in series with a second resistor R2 and a second diode D3 to the drain of Q1, a negative trigger voltage being a sum of threshold voltages of the m diode elements; the negative trigger circuit thereby being conductive to turn-on the clamp transistor to discharge a negative ESD event when Vgs is more negative than the negative trigger voltage.

Example embodiments of the invention provide monolithically integrated bidirectional ESD protection circuits for GaN power switching devices, wherein both the positive and negative trigger levels of the ESD protection circuit may be selected or adjusted to be compatible with operation of the power semiconductor switch Qmain with a positive Vgs for turn-on and a negative Vgs for turn-off, and which may be implemented with compact, small area device topologies.

The foregoing and other features, aspects and advantages of the present invention will become more apparent from the following detailed description, taken in conjunction with the accompanying drawings, of example embodiments of the invention, which description is by way of example only.

DETAILED DESCRIPTION

Figure 1:
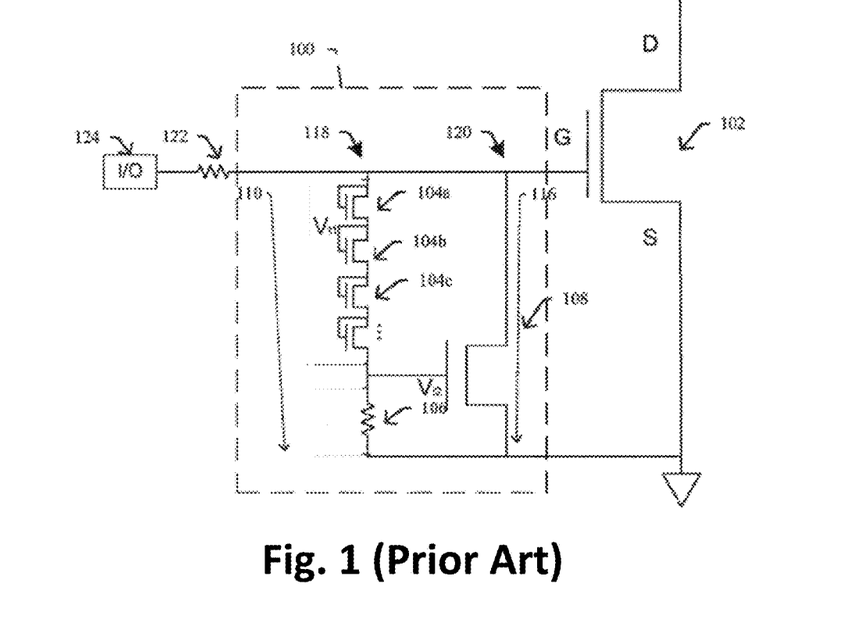
FIG. 1 (Prior Art) shows an example electrostatic discharge (ESD) protection circuit integrated with a GaN power transistor.
Figure 2:
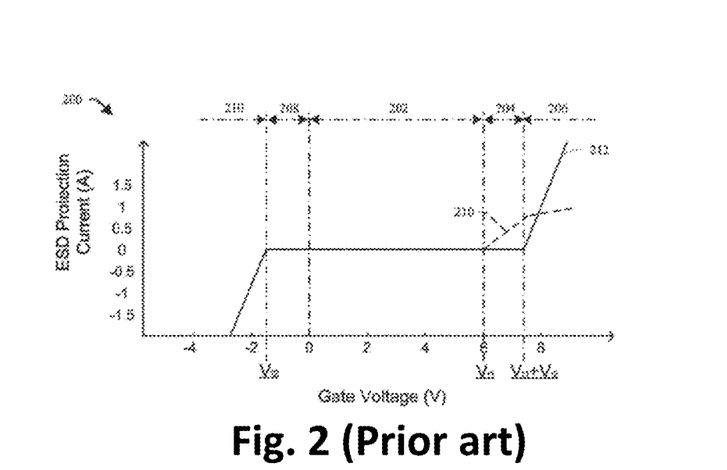
FIG. 2 (Prior Art) is a graph showing protection current of the ESD protection circuit of FIG. 1 in response to a gate voltage.

FIG. 1 (Prior Art) is a schematic diagram illustrating an integrated circuit (IC) chip including an electrostatic discharge (ESD) protection circuit 100 integrated with a GaN semiconductor based transistor (GaN transistor) 102, e.g. an E-mode lateral GaN HEMT, fabricated on a single semiconductor substrate. The ESD protection circuit 100 is connected between a gate terminal and a source terminal of the GaN transistor 102 and is configured to protect the GaN transistor 102 from ESD events. In some embodiments, the ESD protection circuit 100 is connected directly to an I/O pin 124 of the IC chip, or is connected to a gate driver circuit which may include a drive resistor 122. FIG. 2 is a graph 200 showing protection current behavior of the ESD protection circuit 100 of FIG. 1 in response to the gate input voltage. The operation of this ESD protection circuit is described in detail in the above referenced US2018/0026029A1 Lin et al., entitled "Integrated ESD protection circuit for GaN based device", which is incorporated herein by reference. Referring to FIG. 1, the conduction path 110 has positive ESD trigger voltage Vt1, which is the sum of threshold voltages of a plurality of transistors 104a, 104b, 104c, et al. These transistors are connected with gate shorted to drain to function as forward diodes. The second conduction path 116 has a negative trigger voltage Vt2, which is dependent on threshold voltage for reverse conduction of the shunt transistor 108. This ESD protection circuit does not provide control of the negative ESD trigger voltage. It will work if the main transistor is driven with a gate-to-source Vgs=0V for turn-off and a positive Vgs, e.g. 5V or 6V, for turn-on.

Figure 3:
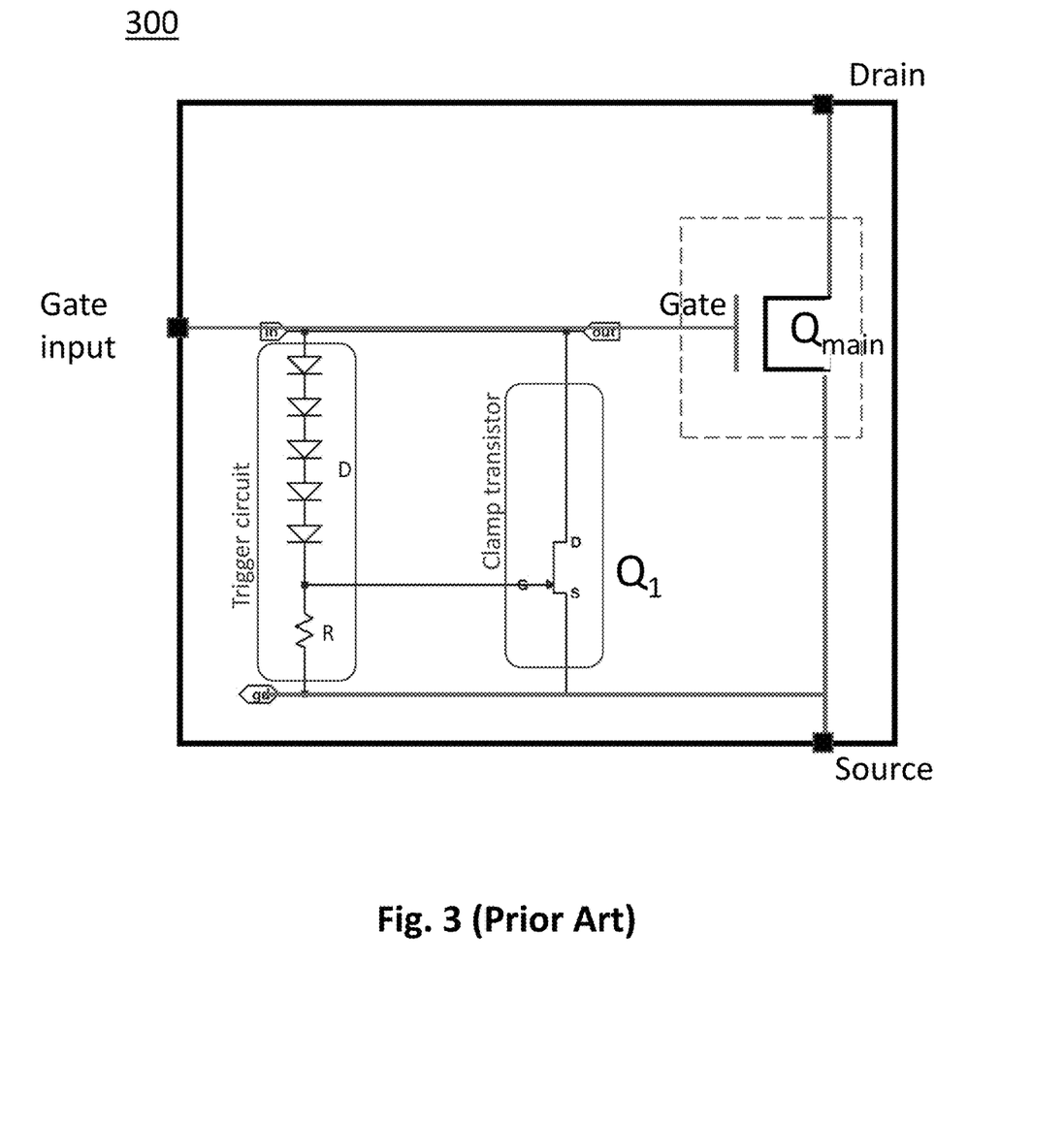
FIG. 3 (Prior Art) shows a simplified schematic of a GaN semiconductor power switching device comprising an integrated ESD protection circuit comprising a clamp transistor and a trigger circuit.

For example, a simplified schematic of GaN semiconductor power switching device comprising an integrated ESD protection circuit shown in FIG. 3 comprises a clamp transistor, and a trigger circuit comprising a diode string D1 comprising a plurality of diodes connected in series and the diode string D1 is connected in series with a resistor R. The node between D1 and the resistor R is connected to the gate of the clamp transistor Q1. The positive ESD trigger level is set by the sum of threshold voltages of the diodes of the diode string D1. For example, if the threshold voltage of each diode is e.g. 1.7V, 5 diodes would provide a combined threshold voltage, or positive ESD trigger voltage, of +8.5V. The positive ESD trigger level may be adjusted by connecting a different number of diodes in series. Thus, if the voltage at the gate input terminal reaches 8.5V, all diodes are conducting, which pulls up the gate G of the clamp transistor Q1 to turn it on in the event of a positive trigger event, and Q1 conducts current to provide a discharge path to dissipate the positive ESD event. A negative gate voltage Vgs turns on the clamp transistor Q1 in reverse direction, so the negative trigger level is set by the by the gate threshold voltage of the clamp transistor, e.g. −1.7V. The negative trigger level is therefore fixed by the threshold voltage for negative conduction of the clamp transistor Q1 and cannot be adjusted. The resistance R is typically large, around 1MΩ, e.g. 400 kΩ to 800 kΩ. The resistance R, in combination with the gate-to-source capacitance Cgs and gate-to-drain capacitance Cgd, delays full reverse conduction, resulting in lower reverse conduction current. This means the ESD circuit has a slow response to negative ESD events. Also, the large integrated resistor R takes up a large die area. Another issue is that where the main transistor switch Qmain is a GaN power transistor switching device, e.g. comprising one or more E-mode lateral GaN HEMTs, it may be desired to drive the transistor switch Qmain with a negative Vgs for gate turn-off. For example, if it is desired to use a negative Vgs of e.g. −3.6V for turn-off, this ESD circuit will not work, because the negative trigger voltage is set by the threshold for reverse conduction of the clamp transistor, e.g. −1.7V or −2V, so it will trigger when Vgs of the clamp transistor goes more negative.

Figure 4:
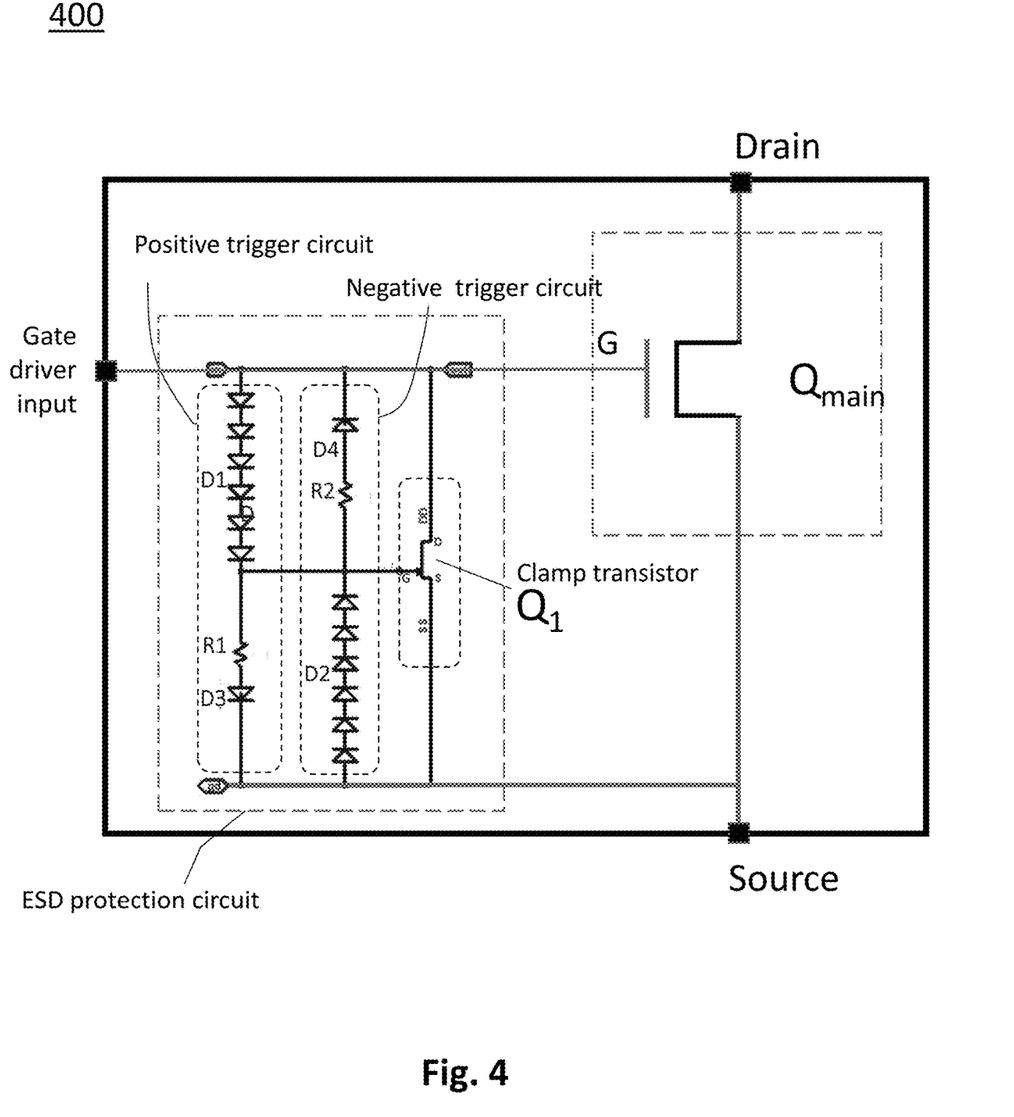
FIG. 4 shows a simplified schematic of a GaN semiconductor power switching device comprising an integrated ESD protection circuit of an example embodiment, comprising a clamp transistor, and negative and positive trigger circuits.

A simplified schematic of GaN semiconductor power switching device 400 comprising an integrated ESD protection circuit of an example embodiment is shown in FIG. 4. The GaN power semiconductor switching device 410 may comprise one or more GaN power transistors, e.g. e-mode GaN HEMTs, which are represented by power transistor switch Qmain, having source, drain and gate terminals. The integrated ESD protection circuit 420 comprises a clamp transistor switch 422, e.g. clamp transistor Q1, and both a positive trigger circuit 424 and a negative trigger circuits 426. Each of the positive and negative trigger circuits 424 and 426 comprise a diode string to set the ESD trigger voltage, in series with a diode and small resistor. The diode and small resistor are used instead of a large resistor R as shown in FIG. 3. The positive trigger circuit comprises a first diode string D1 connected in series with resistor R1 and diode D3. Resistor R1 and diode D3 set the conduction path for diode string D1. The negative trigger circuit comprises a second diode string D2 connected in series with resistor R2 and diode D4. Resistor R2 and diode D4 set the conduction path for diode string D2. The positive trigger voltage is set by the sum of threshold voltages of the plurality of diode elements the first diode string D1. The negative trigger voltage is set by the sum of threshold voltages of the plurality of diode elements of the second diode string D2. For example, if each diode element has a threshold voltage of e.g. 1.7V, the trigger voltage is n*1.7V: to provide a positive trigger voltage of 8.5V, D1 comprises a string of 5 diode elements; and to provide a negative trigger voltage of −6.8V, D2 comprises a string of 4 diode elements. To provide finer control over the positive and negative trigger voltages, it may be preferable to use diode elements having a smaller threshold voltage. For example, if each diode element has a threshold voltage of e.g. 0.7V, the trigger voltage is n*0.7V: to provide a positive trigger voltage of 7V, D1 comprises a string of 10 diode elements; and to provide a negative trigger voltage of −7V, D2 comprises a string of 10 diode elements, and adding or subtracting a diode element will change the trigger voltage by +0.7V. In an example embodiment, the values of resistors R1 and R2 are in the range of ~1 kΩ to ~10 kΩ. The gate widths of the diode strings D1 and D2 are in the submillimeter range, e.g. 0.5 mm; the gate width of the clamp transistor Q1 is larger, e.g. in a range of 1 mm to 5 mm, depending on the desired level of protection, e.g. up to 4000V. When either of the positive or negative trigger circuits conduct to turn-on the gate of clamp transistor Q1, it is the clamp transistor Q1 that conducts the majority of the current to provide a discharge path which dissipates an ESD event. The clamp transistor Q1 may be an e-mode GaN HEMT. An e-mode GaN HEMT is capable of gate controlled forward and reverse conduction, to provide a bidirectional ESD discharge path. This ESD circuit topology has a number of advantages, e.g. trigger voltages for both negative and positive ESD events can be adjusted, e.g. by selecting/connecting an appropriate number of diode elements in each diode string D1 and D2. Another advantage is reduced die area, particularly since the resistor values are significantly reduced relative to the resistor value of a conventional ESD protection circuit, such as shown in FIG. 3.

Figure 5:
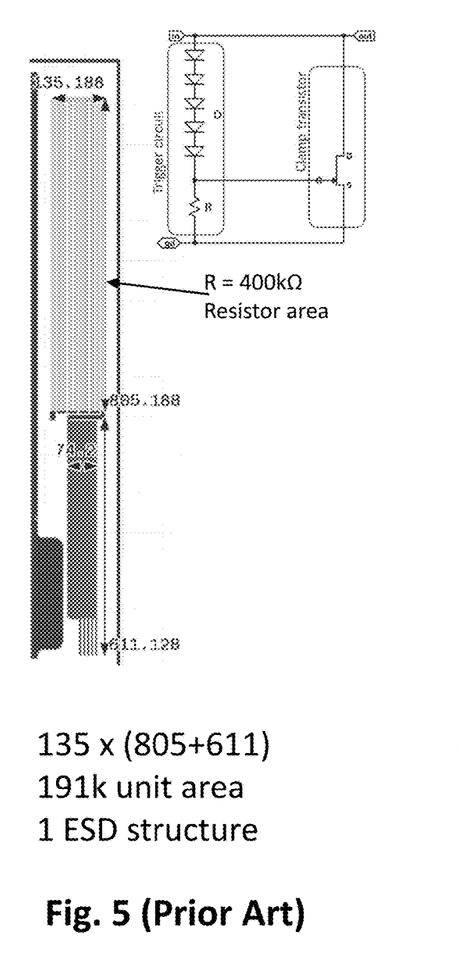
FIG. 5 (Prior Art) shows part of a layout topology comprising the ESD protection circuit of FIG. 3.
Figure 6:
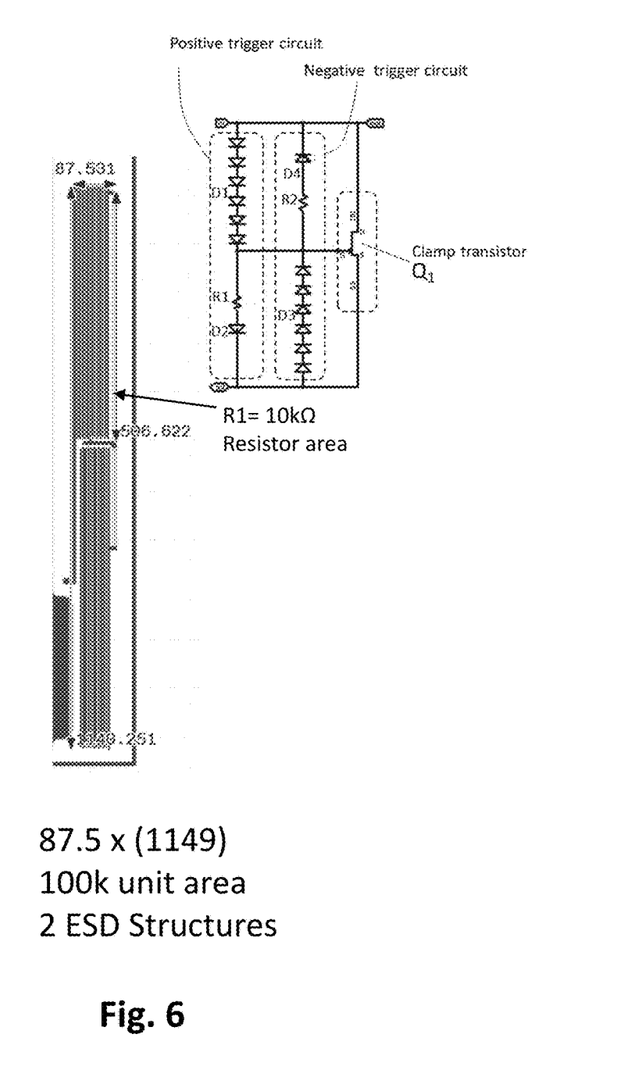
FIG. 6 shows part of a layout topology comprising the ESD protection circuit of FIG. 4.

To illustrate relative die area, examples showing layout topologies and die area for the ESD protection circuits of FIG. 3 and FIG. 4 are shown in FIG. 5 and FIG. 6. In the conventional prior art device structure shown in FIG. 5, the 400 kΩ resistor takes up a large percentage (est. >50%) of the die area used for the ESD protection circuit. In comparison, the ESD protection circuit of the embodiment shown in FIG. 6 occupies less total die area, and provides both negative and positive trigger circuits. Since the ESD protection circuit of FIG. 6 uses much smaller value resistors, e.g. 10 kΩ vs. 400 kΩ, the ESD protection circuit of the embodiment shown in FIG. 6 takes up only a small percentage of the die area of the ESD protection circuit.

Figure 7:
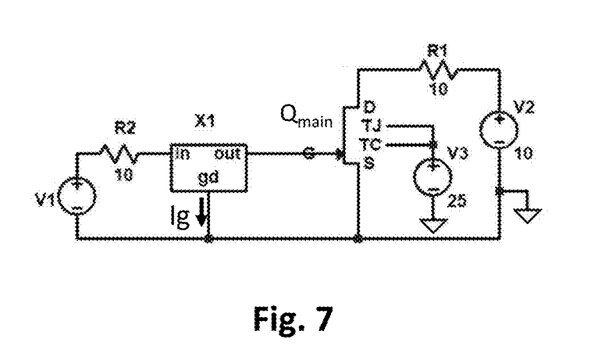
FIG. 7 shows a circuit schematic for evaluation of the ESD protection circuits of FIG. 3 and FIG. 4.

FIG. 7 shows a test circuit for evaluating the ESD circuit of the example embodiment in comparison with a conventional ESD circuit, where circuit element X1 represents the ESD circuit being tested and $Q_{main}$ is the GaN power transistor switch.

Figure 8:
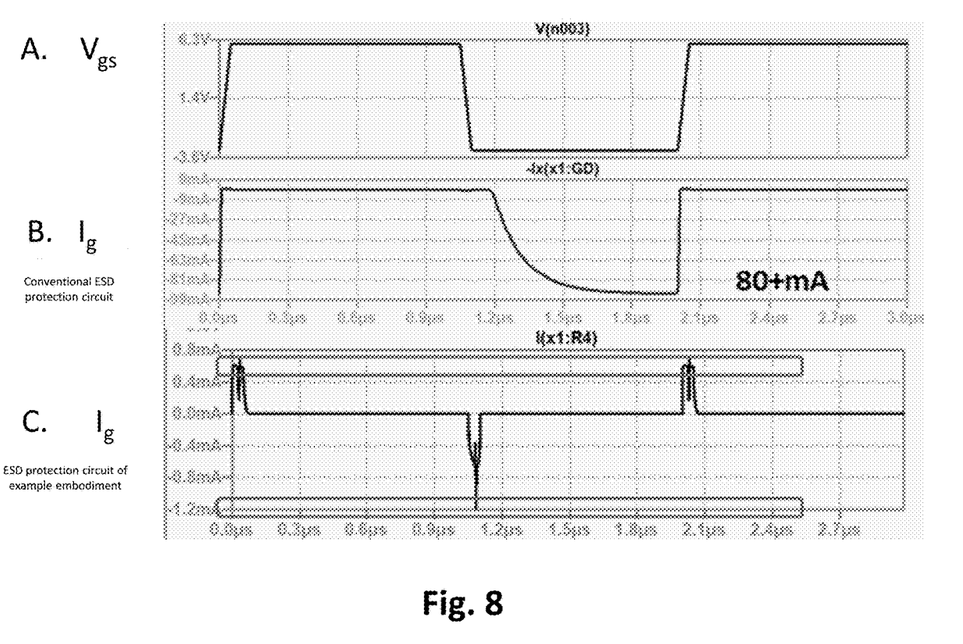
FIG. 8 shows some test results for the ESD protection circuits of FIG. 3 and FIG. 4.

Plots A, B and C in FIG. 8 shows the test results. Plot A shows the gate voltage waveform Vgs of the GaN power transistor, $Q_{main}$, which is normally driven by a positive gate to source voltage Vgs of 6.3V for turn-on, and a negative Vgs of −3.6V for turn off. Using the conventional ESD protection circuit of FIG. 3, as shown in plot B, the discharge current Ig reaches more than 80 mA when the negative Vgs is applied and triggers negative ESD protection, and the response is slow, >0.6 μs. As shown in plot C of FIG. 8, for the ESD protection circuit of the embodiment shown in FIG. 4, the discharge current Ig is limited to around 0.6 mA for a positive trigger event and −1.2 mA for a negative trigger event, and in both positive and negative trigger events, response times are fast.

Figure 9:
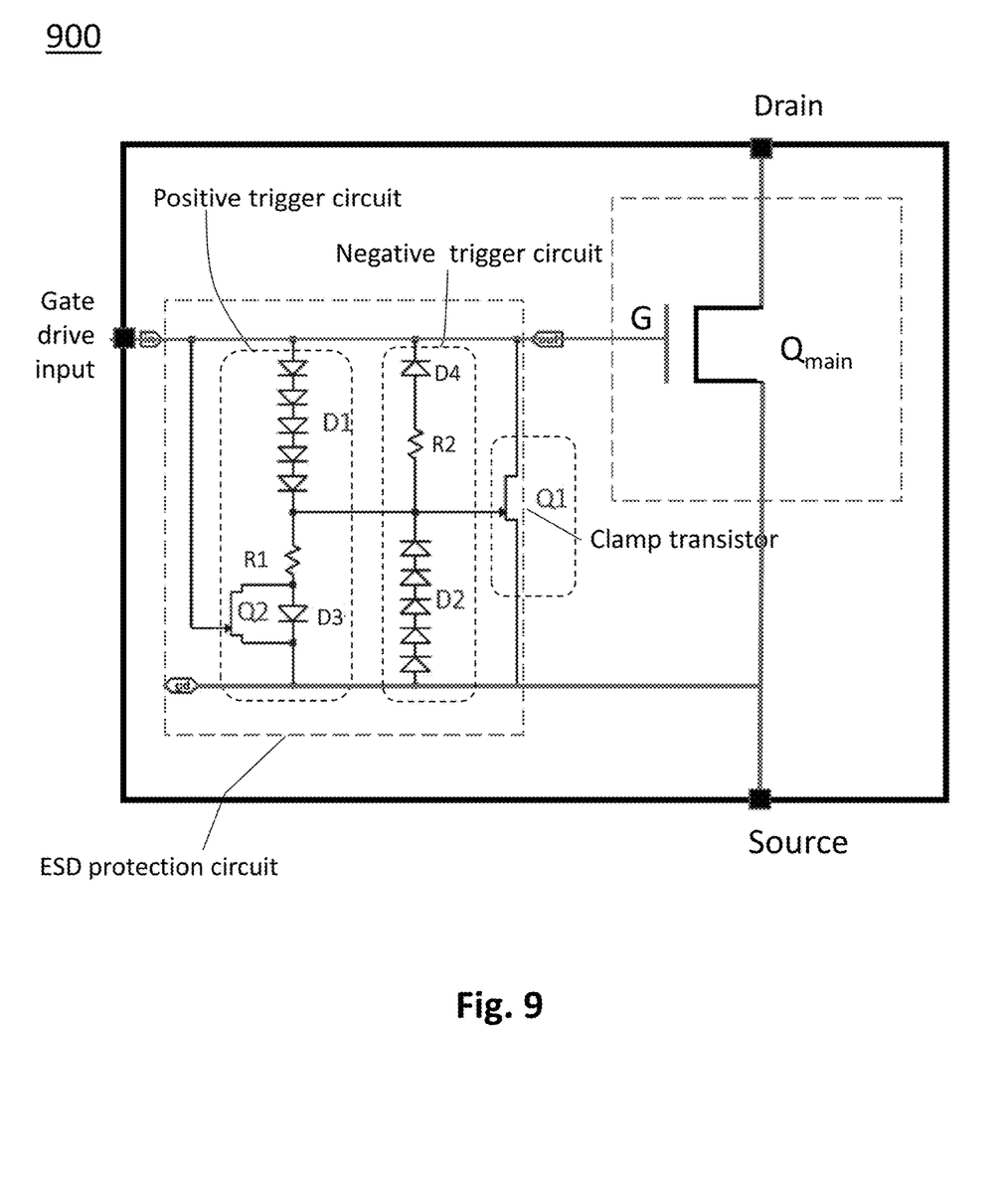
FIG. 9 shows a circuit schematic of a GaN semiconductor power switching device comprising an integrated ESD protection circuit of a second example embodiment.

An ESD protection circuit of a second example embodiment is shown in FIG. 9, It includes an additional transistor Q2. Q2 is connected in parallel with the diode D3, so that when the GaN power transistor Qmain is turned-on during normal operation, it provides a conduction path which bypasses D3 to ensure that the gate of Q1 is strongly pulled down to maintain the clamp transistor Q1 off. Q2 is added to provide better noise immunity, because it ensures that the clamp transistor Q1 is off when the GaN power transistor Qmain is on.

In practice, the diode elements for the diode strings D1 and D2 of the trigger circuits illustrated in FIG. 4 and FIG. 9, would be implemented as diode connected transistor elements. That is, transistor elements with the gate shorted to drain, or gate shorted to source, to operate as diodes which conduct in the required direction. The integrated resistors may be implemented as 2DEG resistors, e.g. D-mode GaN HEMTs, of the appropriate gate-width and gate-length to provide a required resistance value. Integrated resistors can alternatively be fabricated with high resistive metal layers if these are available in the foundry process.

The appropriate number of diode elements of the positive trigger circuit are selected to control the positive trigger voltage. The appropriate number of diode elements of the negative trigger circuit are selected to control the negative trigger voltage, independently of the positive trigger voltage. The values of components of each trigger circuit, including the number of diode elements of each of the positive and negative trigger circuits may be predetermined by design, based on the proposed gate drive voltages $V_{gs}$ for turn-on and turn-off of $Q_{main}$, and required positive and negative trigger voltages. The positive and negative trigger voltages may be adjustable during fabrication, e.g. by trimming to selectively connect or program connection of various numbers of diode elements of each of the positive and/or negative trigger circuits. For active control of the positive trigger voltage, the number of diode elements of the trigger circuit may be switchably controlled. For active control of the negative trigger voltage, the number of diode elements of the trigger circuit may be switchably controlled. Thus one or both of the positive trigger voltage and negative trigger voltage of the integrated ESD protection circuit may be adjusted independently, to accommodate different ranges of Vgs for gate turn-on and gate turn-off during normal operation. The disclosed ESD protection circuits provide reduced losses and increased efficiency. They may also be implemented using a more compact device layout topology than conventional ESD protection circuits.

Figure 10:
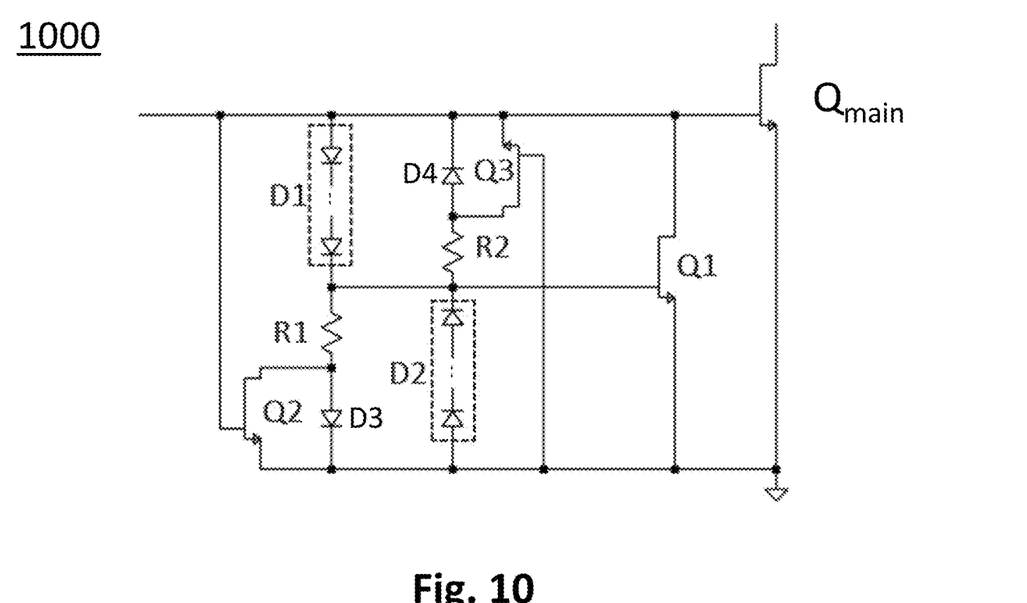
FIG. 10 shows a circuit schematic of a GaN semiconductor power switching device comprising an integrated ESD protection circuit of a third example embodiment.

FIG. 10 shows a circuit schematic of a GaN semiconductor power switching device comprising an integrated ESD protection circuit of a third example embodiment, which is a variant of the embodiment shown in FIG. 9. The positive trigger circuit is the same as the positive trigger circuit of the embodiment shown in FIG. 9, comprising diode string D1, resistor R1, and transistor Q2 with parallel with diode D3. In the negative trigger circuit shown in FIG. 10, the diode D4 shown in FIG. 9 is replaced by a transistor Q3 with parallel diode D4. The gate of the transistor Q3 is connected to the source of the main transistor Qmain. During normal operation mode, Q2 and Q3 function to keep Q1 off, to reduce chance of mis-triggering. As described for the other example embodiments, the number of diodes in the diode string D1 determines the trigger voltage for the positive trigger circuit; and the number of diodes in the diode string D2 determines the trigger voltage for the negative trigger circuit.

Figure 11:
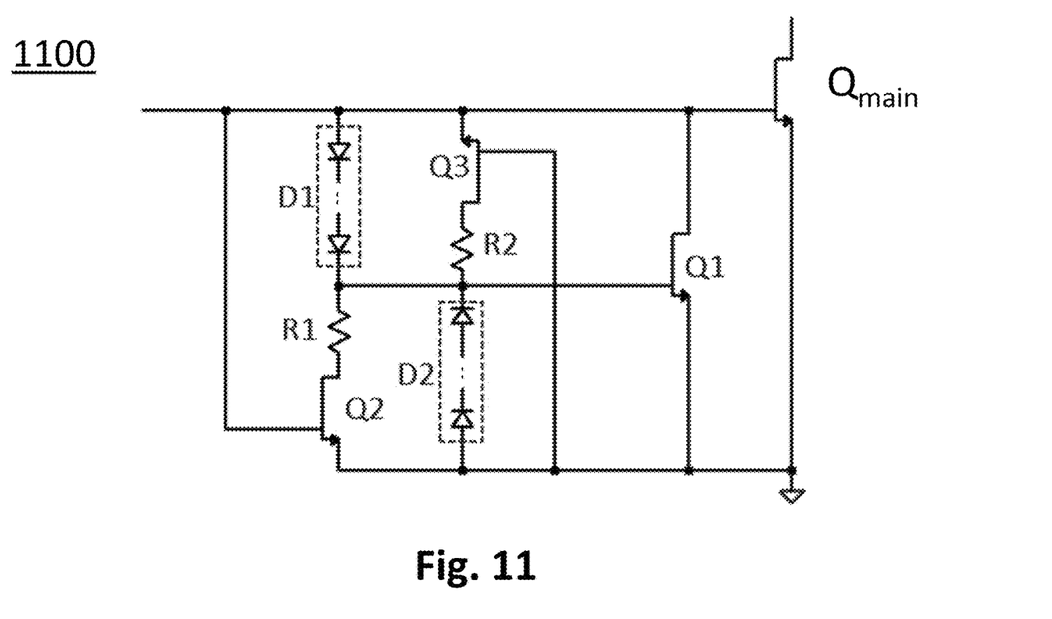
FIG. 11 shows a circuit schematic of a GaN semiconductor power switching device comprising an integrated ESD protection circuit of a fourth example embodiment.

A circuit schematic of a GaN semiconductor power switching device comprising an integrated ESD protection circuit of a fourth example embodiment is shown in FIG. 11. The diodes D3 and D4 shown in FIG. 10 are optional and may be omitted. In the circuit schematic shown in FIG. 11, diodes D3 and D4 are omitted, and transistors Q2 and Q3 function to maintain Q1 in an off-state during normal operational mode. The number of diodes in the diode string D1 determines the trigger voltage for the positive trigger circuit; and the number of diodes in the diode string D2 determines the trigger voltage for the negative trigger circuit.

In the circuits of the embodiments shown in FIG. 4, FIG. 9, FIG. 10 and FIG. 11, values of the resistors R1 and R2 are selected to control the speed of triggering. If the resistor values R1 and R2 are too high, the response of the positive and negative trigger circuits will be too slow. If the resistor values R1 and R2 are too low, this will result in too much current. The resistor values are chosen to control the speed of response and current to avoid interfering with normal operation. For example, it may be required to provide sub-microsecond dissipation of positive and negative trigger events, and allow for a discharge current of a few mA, e.g. in a range from 1 mA to tens of mA. For example, typical resistor values for R1 and R2 may be in a range ~10 k to 20 kΩ, and more generally in a range from ~1 kΩ to <100 kΩ.

Specific embodiments have been described in detail with reference to GaN power switching devices, e.g. comprising one or more e-mode GaN HEMTs. In the example embodiments, the clamp transistor Q1 is an e-mode GaN HEMT that is capable of gate controlled conduction in the both the forward and reverse conduction, to allow for dissipation of both positive and negative ESD events. It will be appreciated that in other embodiments, semiconductor power switching devices comprising integrated ESD protection circuits as disclosed herein may be applicable to power switching devices comprising HEMTs implemented in other semiconductor technologies, where it is required that the ESD protection circuit is compatible with driving the power switching device with a positive Vgs for turn-on and a negative Vgs for turn-off.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A GaN semiconductor power switching device comprising a power transistor switch ($Q_{main}$) and an integrated ESD protection circuit which is compatible with driving $Q_{main}$, during normal operation, with a positive gate-to-source voltage Vgs for turn-on and a negative Vgs for turn-off,
   the ESD protection circuit comprising a clamp transistor Q1 connected between a gate input of $Q_{main}$ and a source of $Q_{main}$ to provide a discharge path for an ESD event, and a positive trigger circuit and a negative trigger circuit connected in parallel between a drain of Q1 and a source of Q1 for turning-on a gate of the clamp transistor Q1 responsive to a positive ESD event or a negative ESD event at the gate input of $Q_{main}$, wherein:
   the positive trigger circuit comprises a first string of a first plurality (n) of diode elements in series connected between the drain of Q1 and the gate of Q1, the first string of the plurality of diode elements being connected in series with a first resistor R1 and a first diode D3 to the source of Q1, a positive trigger voltage being a sum of threshold voltages of the n diode elements; the positive trigger circuit thereby being conductive to turn-on the clamp transistor to discharge a positive ESD event when Vgs meets or exceeds the positive trigger voltage;
   the negative trigger circuit comprising a second string of a second plurality (m) of diode elements in series connected between the source of Q1 and the gate of Q1, the second string of the plurality of diode elements being connected in series with a second resistor R2 and a second diode D4 to the drain of Q1, a negative trigger voltage being a sum of threshold voltages of the m diode elements; the negative trigger circuit thereby being conductive to turn-on the clamp transistor to discharge a negative ESD event when Vgs is more negative than the negative trigger voltage.

2. The GaN semiconductor power switching device of claim 1, comprising a transistor Q2 connected in parallel with said first diode D3 of the positive trigger circuit, the gate of the Q2 being connected to the gate input of Qmain.

3. The GaN semiconductor power switching device of claim 2, comprising a transistor Q3 connected in parallel with said second diode D4 of the positive trigger circuit, the gate of the Q3 being connected to the source of Q1 and Qmain.

4. The GaN semiconductor power switching device of claim 1, comprising a transistor Q3 connected in parallel with said second diode D4 of the positive trigger circuit, the gate of the Q3 being connected to the source of Q1 and Qmain.

5. The GaN semiconductor power switching device of claim 1, wherein said diode elements are transistor elements configured as diodes.

6. The GaN semiconductor power switching device of claim 1, wherein the gate width of Q1 is an order of magnitude greater than the gate widths of the diode elements of the positive trigger circuit and the negative trigger circuit, so that Q1 provides a primary discharge path for sub-microsecond dissipation of positive and negative ESD events.

7. The GaN semiconductor power switching device of claim 1, wherein Q1 has a gate width in a range of a few mm, and the diode elements of the positive trigger circuit and the negative trigger circuit, have sub-mm gate widths.

8. The GaN semiconductor power switching device of any one of claim 1, wherein the first and second resistors R1 and R2 of the positive and negative trigger circuits are selected to control the response time and current without interfering with normal operation.

9. The GaN semiconductor power switching device of claim 1, wherein the first and second resistors R1 and R2 of the positive and negative trigger circuits have a value in a range of 1 kΩ to 20 kΩ.

10. The GaN semiconductor power switching device of claim 1, wherein the first and second resistors R1 and R2 of the positive and negative trigger circuits have a value in a range of ~1 kΩ to <100 kΩ.

11. The GaN semiconductor power switching device of claim 1, wherein said first and second resistors are transistor elements configured as resistors.

12. The GaN semiconductor power switching device of claim 1, wherein the first and second resistors are 2DEG resistors.

13. The GaN semiconductor power switching device of claim 1, wherein the first and second resistors are implemented with high resistive metal layers.

14. The GaN semiconductor power switching device of claim 1, wherein the number of diode elements n of the positive trigger circuit and the number diode elements m of the negative trigger circuit which set the positive trigger voltage and the negative trigger voltage, and the gate width of Q1 are selected to maintain the gate voltage of Qmain during an ESD event within a safe operating range.

15. The GaN semiconductor power switching device of claim 1, wherein the number of diode elements n the positive trigger circuit and the number diode elements m of the negative trigger circuit which set the positive trigger voltage and the negative trigger voltage, and the gate width of Q1 are selected to maintain the gate voltage of Qmain during an ESD event within a safe operating range.

16. The GaN semiconductor power switching device of claim 1 wherein Qmain and Q1 are e-mode GaN HEMTs, and the diode elements are diode configured e-mode GaN HEMTs.

17. The GaN semiconductor power switching device of claim 1, wherein the ESD protection circuit is monolithically integrated with the GaN power semiconductor switching device Qmain.

18. The GaN semiconductor power switching device of claim 1, comprising at least one of the following:
   a. wherein electrostatic discharge (ESD) protection circuit is monolithically integrated with the GaN power semiconductor switching device Qmain;
   b) wherein the electrostatic discharge (ESD) protection circuit is monolithically integrated with the GaN power semiconductor switching device Qmain;
   c) a transistor Q2 connected in parallel with said first diode D3 of the positive trigger circuit, the gate of the Q2 being connected to the gate input of Qmain;
   d) a transistor Q3 connected in parallel with said second diode D4 of the positive trigger circuit, the gate of the Q3 being connected to the source of Q1 and Qmain;
   e) a transistor Q2 connected in parallel with said first diode D3 of the positive trigger circuit, the gate of the Q2 being connected to the gate input of Qmain, a transistor Q3 connected in parallel with said second diode D4 of the positive trigger circuit, the gate of the Q3 being connected to the source of Q1 and Qmain;
   f) wherein said diode elements are transistor elements configured as diodes;
   g) the gate width of the Q1 is an order of magnitude greater than the gate widths of the diode elements of the positive trigger circuit and the negative trigger circuit, so that Q1 provides a primary discharge path for sub-microsecond dissipation of positive and negative ESD events;
   h) wherein Q1 has a gate width in a range of a few mm, and the diode elements of the positive trigger circuit and the negative trigger circuit, have sub-mm gate widths;
   i) wherein the first and second resistors R1 and R2 of the positive and negative trigger circuits are selected to control the response time and current without interfering with normal operation;
   j) wherein the first and second resistors R1 and R2 of the positive and negative trigger circuits have a value in a range of ~1 kΩ to <100 kΩ;
   k) wherein said first and second resistors are transistor elements configured as resistors;
   l) wherein the first and second resistors are 2DEG resistors;
   m) wherein the first and second resistors are implemented with high resistive metal layers; l) wherein the number of diode elements n of the positive trigger circuit and the number diode elements m of the negative trigger circuit which set the positive trigger voltage and the negative trigger voltage, and the gate width of Q1 are selected to maintain the gate voltage of Qmain during an ESD event within a safe operating range; and
   n) wherein Qmain and Q1 are e-mode GaN HEMTs, and the diode elements are diode configured e-mode GaN HEMTs.

19. A GaN semiconductor power switching device comprising a power transistor switch (Qmain) and an integrated electrostatic discharge (ESD) protection circuit which is compatible with driving Qmain, during normal operation, with a positive gate-to-source voltage Vgs for turn-on and a negative Vgs for turn-off,
   the ESD protection circuit comprising a clamp transistor Q1 connected between a gate input of $Q_{main}$ and a source of $Q_{main}$ to provide a discharge path for an ESD event, and a positive trigger circuit and a negative trigger circuit connected in parallel between a drain of Q1 and a source of Q1 for turning-on a gate of the clamp transistor Q1 responsive to a positive ESD event or a negative ESD event at the gate input of $Q_{main}$, wherein:
   the positive trigger circuit comprises a first string of a first plurality (n) of diode elements in series connected between the drain of Q1 and the gate of Q1, the first string of the plurality of diode elements being connected in series with a first resistor R1 and a transistor Q2 to the source of Q1, and the gate of Q2 being connected to a gate input of Qmain; a positive trigger voltage being a sum of threshold voltages of the n diode elements; the positive trigger circuit thereby being conductive to turn-on the clamp transistor to discharge a positive ESD event when Vgs meets or exceeds the positive trigger voltage; and
   the negative trigger circuit comprising a second string of a second plurality (m) of diode elements in series connected between the source of Q1 and the gate of Q1, the second string of the plurality of diode elements being connected in series with a second resistor R2 and transistor Q3 to the drain of Q1, the gate of Q3 being connected to the source of Q1 and Qmain;
   a negative trigger voltage being a sum of threshold voltages of the m diode elements; the negative trigger circuit thereby being conductive to turn-on the clamp transistor to discharge a negative ESD event when $V_{gs}$ is more negative than the negative trigger voltage.

20. The GaN semiconductor power switching device of claim 19, comprising at least one of the following:
   a) wherein the ESD protection circuit is monolithically integrated with the GaN power semiconductor switching device Qmain;
   b) wherein said diode elements are transistor elements configured as diodes;
   c) the gate width of the Q1 is an order of magnitude greater than the gate widths of the diode elements of the positive trigger circuit and the negative trigger circuit, so that Q1 provides a primary discharge path for sub-microsecond dissipation of positive and negative ESD events;
   d) wherein Q1 has a gate width in a range of a few mm, and the diode elements of the positive trigger circuit and the negative trigger circuit, have sub-mm gate widths;
   e) wherein the first and second resistors R1 and R2 of the positive and negative trigger circuits are selected to control the response time and current without interfering with normal operation;
   f) wherein the first and second resistors R1 and R2 of the positive and negative trigger circuits have a value in a range of ~1 kΩ to <100 kΩ;
   g) wherein said first and second resistors are transistor elements configured as resistors;
   h) wherein the first and second resistors are 2DEG resistors;
   i) wherein the first and second resistors are implemented with high resistive metal layers; l) wherein the number of diode elements n of the positive trigger circuit and the number diode elements m of the negative trigger circuit which set the positive trigger voltage and the negative trigger voltage, and the gate width of Q1 are selected to maintain the gate voltage of Qmain during an ESD event within a safe operating range; and j) wherein Qmain and Q1 are e-mode GaN HEMTs, and the diode elements are diode configured e-mode GaN HEMTs.

\* \* \* \* \*